United States Patent
Dhindsa

(10) Patent No.: US 9,267,208 B2
(45) Date of Patent: Feb. 23, 2016

(54) METHODS FOR CONTROLLING PLASMA CONSTITUENT FLUX AND DEPOSITION DURING SEMICONDUCTOR FABRICATION AND APPARATUS FOR IMPLEMENTING THE SAME

(71) Applicant: Lam Research Corporation, Fremont, CA (US)

(72) Inventor: Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/046,873

(22) Filed: Oct. 4, 2013

(65) Prior Publication Data

US 2014/0034609 A1 Feb. 6, 2014

Related U.S. Application Data

(62) Division of application No. 12/882,560, filed on Sep. 15, 2010, now Pat. No. 8,591,755.

(51) Int. Cl.
| | | |
|---|---|---|
| *G01R 31/30* | (2006.01) | |
| *G01R 31/00* | (2006.01) | |
| *H01L 21/306* | (2006.01) | |
| *C23C 16/00* | (2006.01) | |
| *C23F 1/08* | (2006.01) | |
| *H01J 37/32* | (2006.01) | |
| *H01L 21/311* | (2006.01) | |
| *H01L 21/67* | (2006.01) | |

(52) U.S. Cl.
CPC ............ *C23F 1/08* (2013.01); *H01J 37/32935* (2013.01); *H01L 21/31116* (2013.01); *H01L 21/31144* (2013.01); *H01L 21/67248* (2013.01)

(58) Field of Classification Search
CPC .................................................. H01L 21/67248
See application file for complete search history.

(56) References Cited

U.S. PATENT DOCUMENTS

| | | | | |
|---|---|---|---|---|
| 5,948,283 A | * | 9/1999 | Grosshart | H01J 37/32715 118/666 |
| 6,165,271 A | * | 12/2000 | Zhao | C23C 16/4401 118/715 |
| 7,009,281 B2 | * | 3/2006 | Bailey, III | H01J 37/32522 156/345.24 |
| 8,449,786 B2 | * | 5/2013 | Larson | H01L 21/67103 118/723 R |

(Continued)

FOREIGN PATENT DOCUMENTS

JP     2007-103635 A     4/2007 .............. C23C 16/52

*Primary Examiner* — Gordon R Baldwin
*Assistant Examiner* — Charlee Bennett
(74) *Attorney, Agent, or Firm* — Martine Penilla Group, LLP

(57) ABSTRACT

A time-dependent substrate temperature to be applied during a plasma process is determined. The time-dependent substrate temperature at any given time is determined based on control of a sticking coefficient of a plasma constituent at the given time. A time-dependent temperature differential between an upper plasma boundary and a substrate to be applied during the plasma process is also determined. The time-dependent temperature differential at any given time is determined based on control of a flux of the plasma constituent directed toward the substrate at the given time. The time-dependent substrate temperature and time-dependent temperature differential are stored in a digital format suitable for use by a temperature control device defined and connected to direct temperature control of the upper plasma boundary and the substrate. A system is also provided for implementing upper plasma boundary and substrate temperature control during the plasma process.

20 Claims, 10 Drawing Sheets

(56) References Cited

U.S. PATENT DOCUMENTS

| | | | |
|---|---|---|---|
| 2007/0042603 A1 | 2/2007 | Kropewnicki et al. | 438/689 |
| 2009/0044752 A1* | 2/2009 | Furuya | C23C 16/45572 118/723 E |
| 2009/0111276 A1* | 4/2009 | Dhindsa et al. | 438/710 |

* cited by examiner

METHODS FOR CONTROLLING PLASMA CONSTITUENT FLUX AND DEPOSITION DURING SEMICONDUCTOR FABRICATION AND APPARATUS FOR IMPLEMENTING THE SAME

CLAIM OF PRIORITY

This application is a divisional application under 35 U.S.C. 121 of U.S. patent application Ser. No. 12/882,560, filed on Sep. 15, 2010, which is incorporated herein by reference in its entirety.

BACKGROUND

In semiconductor fabrication, a plasma etching process can be used to transfer a photoresist mask pattern of a portion of a circuit onto one or more materials (conductors or insulators) on a semiconductor wafer. In the plasma etching process, the plasma acts to etch away materials exposed in the open areas of the photoresist mask pattern, i.e., in the areas that are not protected by the photoresist mask. The etching reaction is accomplished by chemically active and electrically charged species (ions) present in the plasma. The plasma is generated from a reactant mixture within a plasma chamber. In some applications, an electric field can be used to accelerate ions present in the plasma towards the wafer, thereby providing directionality to the etching of materials from the wafer. When the etching process is completed, the photoresist mask material is removed from the wafer.

During the plasma etching process, the photoresist material can be eroded or altered by the etching chemistry and/or etching byproduct materials. Too much erosion of the photoresist material can cause distortion in the photoresist mask pattern and corresponding etching distortion in the wafer. Also, without proper control, the etching byproducts can reduce the size of the openings of the photoresist mask pattern, thereby preventing the etching constituents of the plasma from reaching the materials to be etched. Moreover, the above-identified issues become even more problematic in fabrication of advanced devices that have high aspect ratio features and very small dimensions. It is in this context that embodiments of the present invention arise.

SUMMARY

In one embodiment, a method is disclosed for defining a plasma process to be performed on a substrate. The method includes determining a time-dependent substrate temperature to be applied during the plasma process. The time-dependent substrate temperature at any given time is determined based on control of a sticking coefficient of a plasma constituent at the given time. The method also includes determining a time-dependent temperature differential between an upper plasma boundary and a substrate to be applied during the plasma process. The substrate serves as a lower plasma boundary. The time-dependent temperature differential at any given time is determined based on control of a flux of the plasma constituent directed toward the substrate at the given time. The method further includes storing the determined time-dependent substrate temperature and time-dependent temperature differential in a digital format suitable for use by a temperature control device defined and connected to direct temperature control of the upper plasma boundary and the substrate during the plasma process.

In another embodiment, a method is disclosed for operating a plasma processing chamber. The method includes obtaining a time-dependent substrate temperature to be applied during a plasma process. The time-dependent substrate temperature at any given time is correlated to control of a sticking coefficient of a plasma constituent at the given time. The method also includes obtaining a time-dependent temperature differential between an upper plasma boundary and a substrate to be applied during the plasma process. The substrate serves as a lower plasma boundary. The time-dependent temperature differential at any given time is correlated to control of a flux of the plasma constituent toward the substrate at the given time. The method also includes holding the substrate on a top surface of a substrate holder. The substrate holder is disposed at a location below and spaced apart from an upper electrode assembly which defines the upper plasma boundary. The method further includes controlling a temperature of the substrate holder during the plasma process so as to control a temperature of the substrate in accordance with the time-dependent substrate temperature. Also, the method includes controlling a temperature of the upper electrode assembly during the plasma process so as to comply with the time-dependent temperature differential between the upper plasma boundary and the substrate.

In another embodiment, a system for plasma processing of a substrate is disclosed. The system includes a plasma processing chamber. A substrate holder is disposed within the plasma processing chamber and is defined to hold a substrate. The substrate holder includes one or more temperature control devices. The system also includes an upper electrode assembly disposed within the plasma processing chamber above and spaced apart from the substrate holder. The upper electrode assembly includes one or more temperature control devices. The system further includes a temperature control module defined to control the one or more temperature control devices of the substrate holder to maintain a target substrate temperature. The temperature control module is further defined to control the one or more temperature control devices of the upper electrode assembly to maintain a target temperature differential between the substrate and the upper electrode assembly.

Other aspects and advantages of the invention will become apparent from the following detailed description, taken in conjunction with the accompanying drawings, illustrating by way of example the principles of the invention.

DETAILED DESCRIPTION

Figure 1A:
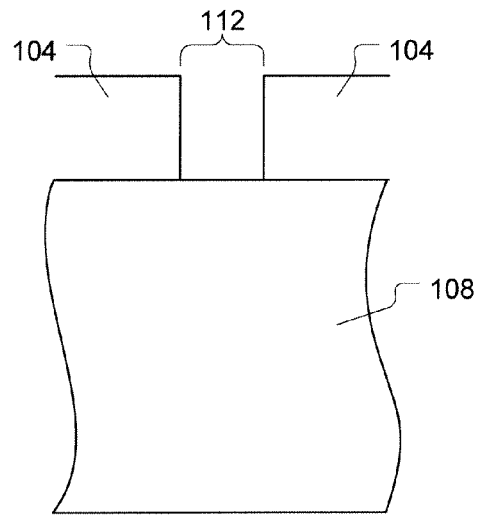
FIG. 1A shows a photoresist mask material disposed over a dielectric material as part of a substrate.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In semiconductor fabrication, a plasma etching process generally uses a patterned mask material to protect portions of the substrate that are not to be etched. An objective in plasma etching is to formulate the plasma so as to optimize etching selectivity of the exposed materials on the substrate, rather than the mask material. However, it is generally inevitable that a plasma will etch the mask material to some extent. Also, it often happens that a material to be etched on the substrate will require a plasma formulation that also has an increased capability of etching the mask material. Therefore, a challenge in plasma etching is to manage etching of the mask material to ensure that the mask pattern is accurately transferred to the substrate and to ensure that the mask material provides adequate protection of the substrate through completion of the etching process. Additionally, etching byproduct materials need to be controlled to ensure that they do not interfere with the etching process.

In some plasma etching processes, the gas mixture from which the plasma is formed may include a passivation gas. This passivation gas can be defined to selectively reduce the etching damage and erosion of the mask material relative to the materials to be etched. In one embodiment, the passivation gas generates an etching resistant coating on the surface of the mask material, which acts as a barrier to slow down the etching of the mask material. The etching resistant coating associated with the passivation gas can also extend to cover vertical surfaces within etched regions, so as to reduce erosion of the vertical surfaces and associated undercutting of upper features. In the presence of the etching resistant coating provided by the passivation gas, vertically biased etching can be used more aggressively to advance etching in the direction perpendicular to the substrate. Therefore, use of a passivation gas in the etching plasma mixture can be useful for mask protection during anisotropic etching processes, particularly those that use high energy directional ion bombardment.

In one embodiment, the reactive gas mixture from which the plasma is formed includes etching gases and a polymer forming gas that serves as a passivation gas. In the plasma, the etching gases form highly reactive species, which serve to etch the exposed materials on the substrate, with inadvertent etching the mask material also. Etching reactions occur on both the vertical and lateral surfaces on the substrate, which results in isotropic etching profiles. The presence of the polymer forming gas in the plasma and the corresponding etching resistant coating, as deposited on the surfaces of the etched structures and mask material, serves to enhance both etching selectivity to appropriate materials and etching anisotropy in the presence of electrical bias.

Figure 1B:
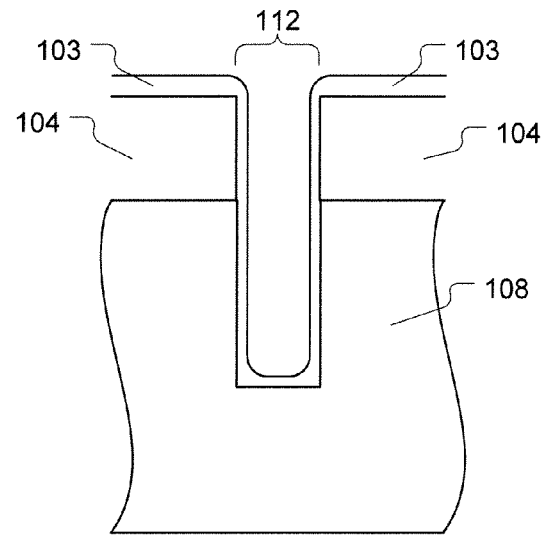
FIG. 1B also shows a thinning of the mask material through the etching process.
Figure 1C:
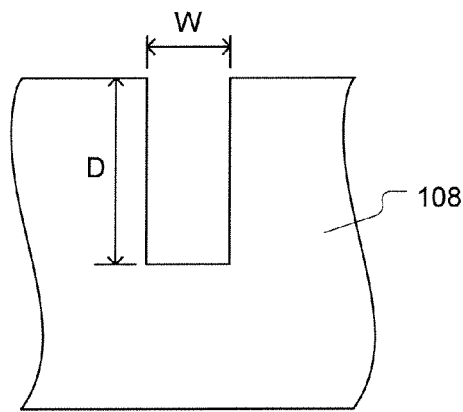
FIG. 1C shows the etched region of the dielectric material following removal of the etching resistant coating and the remaining mask material.

FIGS. 1A-C show an exemplary process sequence of forming a feature (or structure), in accordance with one embodiment of the present invention. FIG. 1A shows a photoresist mask material 104 disposed over a dielectric material 108 as part of a substrate. The mask material 104 forms a pattern that includes an open area 112. FIG. 1B shows the dielectric material 108 etched within the opening 112. FIG. 1B also shows a thinning of the mask material 104 through the etching process. Also, during the etching process, the mask material 104 and the etched region within the dielectric material 108 are covered by a coating of etching resistant material 103, e.g., polymer coating. FIG. 1C shows the etched region of the dielectric material 108 following removal of the etching resistant coating 103 and the remaining mask material 104.

During the etching process, the mask materials can be eroded and/or damaged as the etching proceeds through the materials targeted for etching. Some of the mask material erosion/damage may be transferred to the underlying materials leaving undesirable pattern distortions such as striation, CD (critical dimension) enlargement, faceting, etc. As shown in FIG. 1C, the finished etched feature within the dielectric material 108 is defined by a width W and a depth D. The aspect ratio (AR) of the etched feature is defined by the ratio of the feature depth to the feature width (D/W). In advanced integrated circuit device manufacturing, the width of an etched feature can be as small as 0.1 micron (micrometer) or less, and the depth of the etched feature can be 3 micron or more, thereby causing the etched feature to have an aspect ratio of 50 to 60, or even higher. By way of example, high aspect ratio feature etching can occur in fabrication of contact holes, via holes, trenches, memory cell structures, among many others.

Figure 2A:
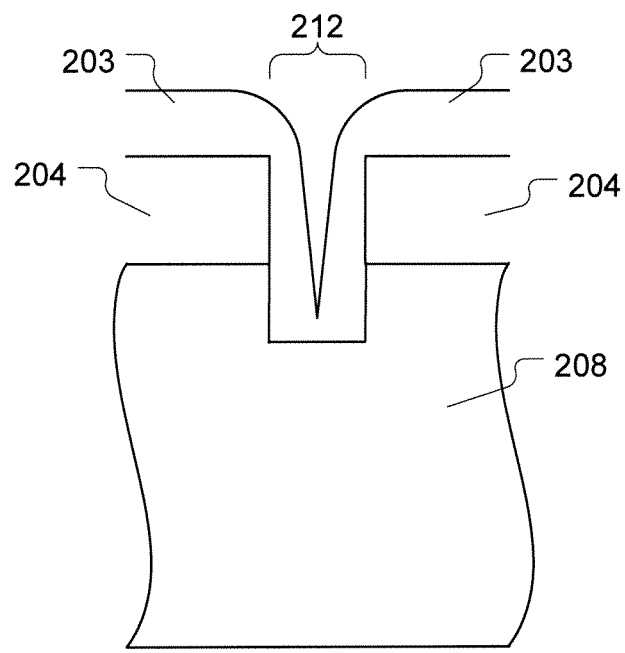
FIG. 2A demonstrates how too much polymer coating can pinch off the etched opening and prematurely shutdown the etching process within the etched opening.

When etching features with small dimension and high aspect ratio, if too much of the etching resistant coating, e.g., polymer coating, is deposited on the mask material and on the sidewalls within the etched feature, the etching resistant coating can hinder the advancement of the etching front and stop the etching of the target material that is to be etched. FIG. 2A demonstrates how too much polymer coating can pinch off the etched opening and prematurely shutdown the etching process within the etched opening. In FIG. 2A, a patterned mask material 204 is disposed over a target material (material to be etched, e.g., dielectric material). The patterned mask material 204 includes an opening 212 through which the target material is exposed to the plasma and correspondingly etched. During the plasma etching process, an etching resistant coating 203, such as a polymer coating, is deposited on the mask material 204 and on the sidewalls of the etched region. FIG. 2A illustrates that when too much of the etching resistant coating 203 builds up, the etching resistant coating 203 pinches together and closes off the etched region from further exposure to the plasma, thereby effective stopping the etching process in the opening 212.

Figure 2B:
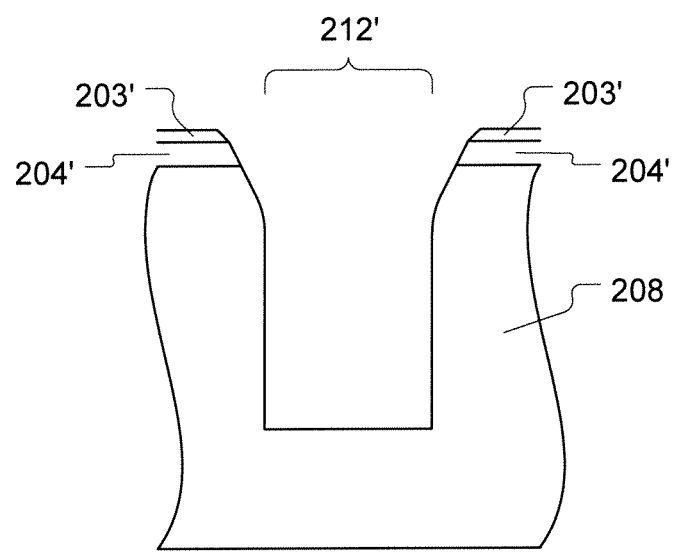
FIG. 2B demonstrates how not enough polymer coating deposition can cause premature removal of the mask material and widening of the etched feature.

Also, if not enough of the etching resistant coating, e.g., polymer coating, is deposited on the mask material and on the sidewalls within the etched feature, the mask material and/or sidewalls of the etched feature can be etched too quickly before a desired depth of the etched feature is obtained, thereby causing deformation and/or widening of the etched feature. FIG. 2B demonstrates how not enough polymer coating deposition can cause premature removal of the mask material and widening of the etched feature. In FIG. 2B, a patterned mask material 204' is disposed over the target material 208, and includes an opening 212' through which the target material is exposed to the plasma and correspondingly etched. Also, an etching resistant coating 203', such as a polymer coating, is deposited on the mask material 204'. FIG. 2B illustrates that when not enough of the etching resistant coating 203 is deposited, the mask material can be thinned and eroded near the opening 212', and the sidewalls of the etched feature can be etched too much, resulting in an adverse widening of the opening 212'. For advanced device manufacturing, maintaining the small etched feature dimensions and achieving the etch depth are both important. Therefore, it is necessary to manage the amount and distribution of the etching resistant coating, e.g., polymer coating, deposited during the plasma etching process.

Figure 3A:
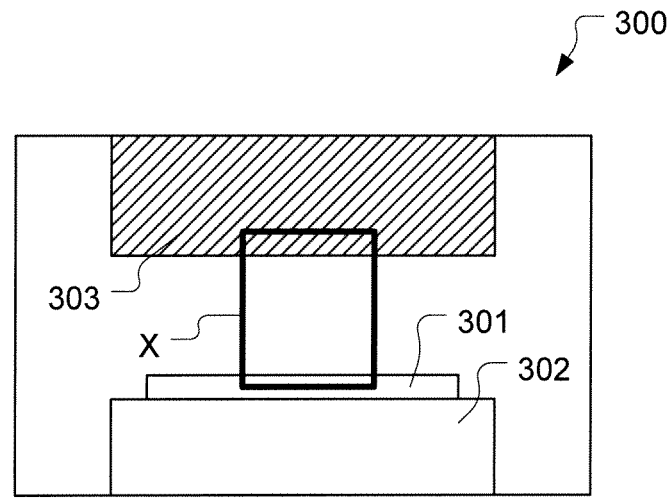
FIG. 3A shows a plasma processing chamber for use in performing etching operations, in accordance with one embodiment of the present invention.
Figure 3B:
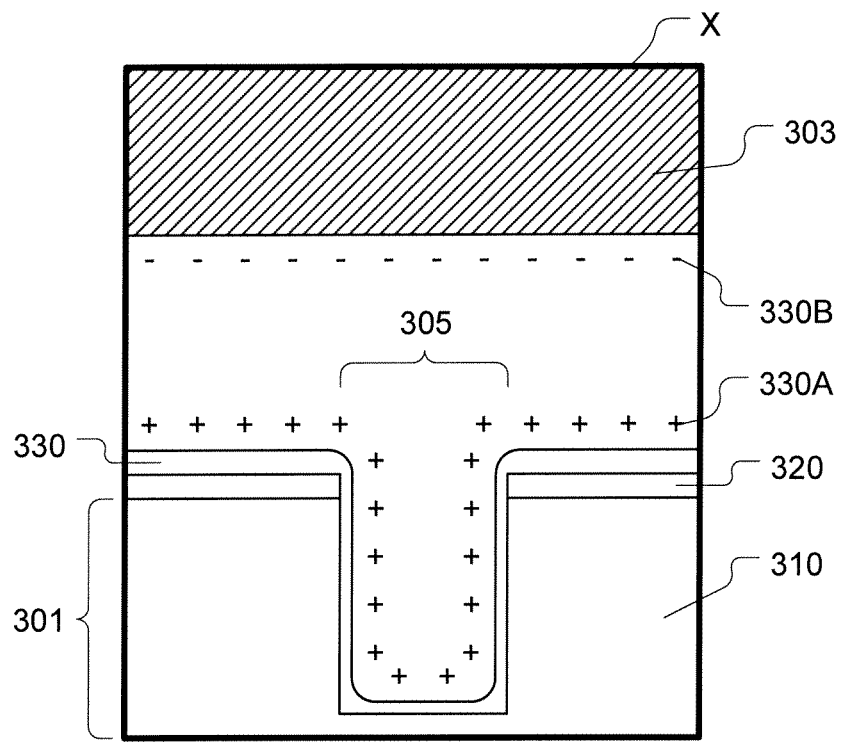
FIG. 3B shows an enlarged area X of FIG. 3A, in accordance with one embodiment of the present invention.

FIG. 3A shows a plasma processing chamber 300 for use in performing etching operations, in accordance with one embodiment of the present invention. In the chamber 300, a substrate 301 sits on a substrate support 302, which could be an electrode or an electrostatic chuck (ESC). An upper electrode 303 is positioned above and spaced apart from the substrate support 302. FIG. 3B shows an enlarged area X of FIG. 3A, in accordance with one embodiment of the present invention. The enlarged area X includes a portion of the upper electrode 303, and a portion of the substrate 301. The portion of the substrate 301 includes a target material 310 to be etched and a patterned mask material 320 disposed over the target material 310. The patterned mask material 320 includes an opening 305 through which the target material 310 is exposed to the plasma during the etching process. Exposure of the target material 310 to the plasma causes an etched feature to be formed in the target material 310 where the opening 305 exists.

During the etching process, an etching resistant material 330, such as a polymer material, is deposited from the plasma onto the mask material 320 and surfaces within the etched feature. The etching resistant material 330 within the plasma has a mass distribution, such that some of the etching resistant material 330 particles have larger mass than others. In FIG. 3B, larger mass particles 330A of the etching resistant material 330 are denoted by "+" and smaller mass particles 330B of the etching resistant material 330 are denoted by "−". During the plasma etching process, the etching resistant material 330 is subject to a thermophoresis effect, in which the larger mass particles 330A move toward surfaces/regions of lower temperature, and the smaller mass particles 330B move toward surfaces/regions of higher temperature.

In the example of FIG. 3B, a temperature difference exists between the upper electrode 303 and the substrate 301, with the temperature of the upper electrode 303 being higher than the temperature of the substrate 301. Therefore, in the example of FIG. 3B, larger mass particles 330A of the etching resistant material 330 within the plasma move toward the lower temperature substrate 301, as denoted by the "+" symbols. And, conversely, smaller mass particles 330B of the etching resistant material 330 within the plasma move toward the higher temperature upper electrode 303, as denoted by the "−" symbols.

In one example embodiment, the temperature difference between the upper electrode 303 and the substrate 301 may be about 20° C., with the upper electrode 303 having the higher temperature. However, it should be understood, that plasma processes can vary significantly with regard to temperature requirements. Sometimes the upper electrode 303 will have a higher temperature than the substrate 301, and sometimes the substrate 301 will have a higher temperature than the upper electrode 303. Also, the magnitude of temperature difference between the upper electrode 303 and the substrate 301, or between any other surfaces within the chamber 300, can vary from process-to-process and within a given process. It should be appreciated that control of the temperature differential(s) between surfaces to which the plasma is exposed, e.g., between the upper electrode 303 and the substrate 301, enables control of the spatial mass distribution of the etching resistant material 330 within the plasma. And, by controlling the spatial mass distribution of the etching resistant material 330 within the plasma, it is possible to control the mass distribution of the etching resistant material 330 particles near the substrate 301.

Figure 3C:
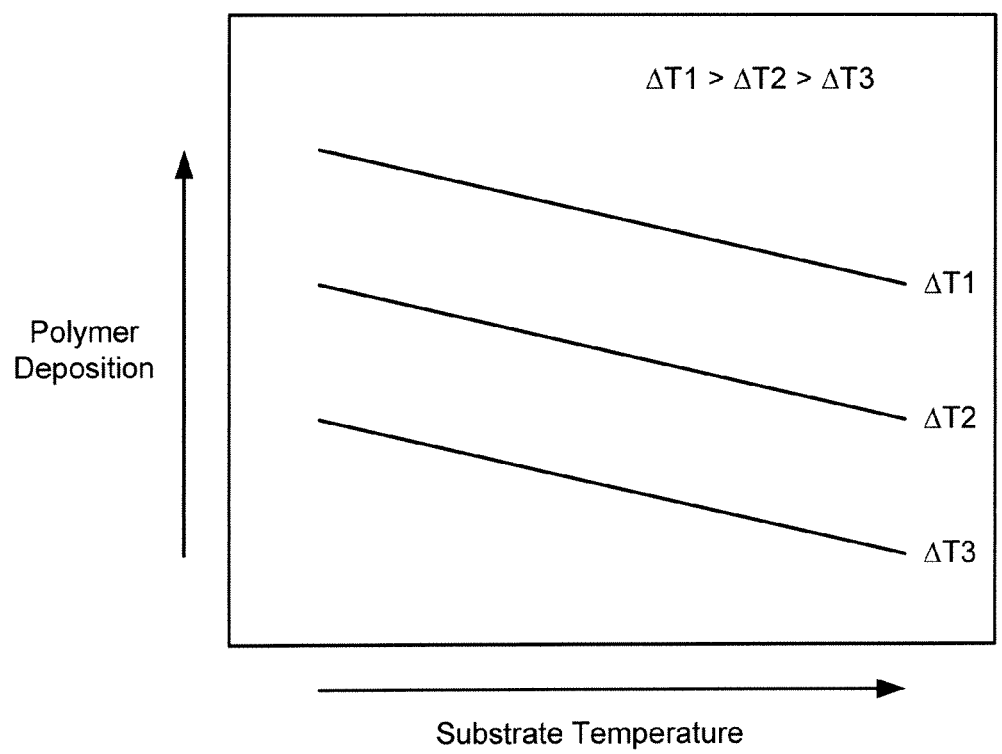
FIG. 3C shows a polymer deposition trend chart for a dielectric etching plasma chemistry that uses $C_4F_6$, $O_2$, and inert gas (Ar), in accordance with one embodiment of the present invention.

FIG. 3C shows a polymer deposition trend chart for a dielectric etching plasma chemistry that uses $C_4F_6$, $O_2$, and inert gas (Ar), in accordance with one embodiment of the present invention. In the etching plasma chemistry, $C_4F_6$ is the polymer forming gas. A temperature differential ($\Delta T$) is defined as the temperature difference between the upper electrode and the substrate, i.e., $\Delta T = T_{upper\ electrode} - T_{substrate}$. The chart of FIG. 3C shows that an increase in $\Delta T$ provides more polymer deposition on the substrate. It should be understood that more than one polymer forming gas can be used in the etching plasma chemistry. Examples of polymer forming gas include, but are not limited to, $CH_3F$, $CH_2F_2$, $C_2H_5F$, $C_3H_7F$, $C_2H_3F$, $CH_4$, $C_2H_4$, $C_2H_6$, $C_2H_2$, $C_3H_8$, and $SiH_4$, $Si(CH_3)_4$, $Si(C_2H_5)_4$.

Figure 3D:
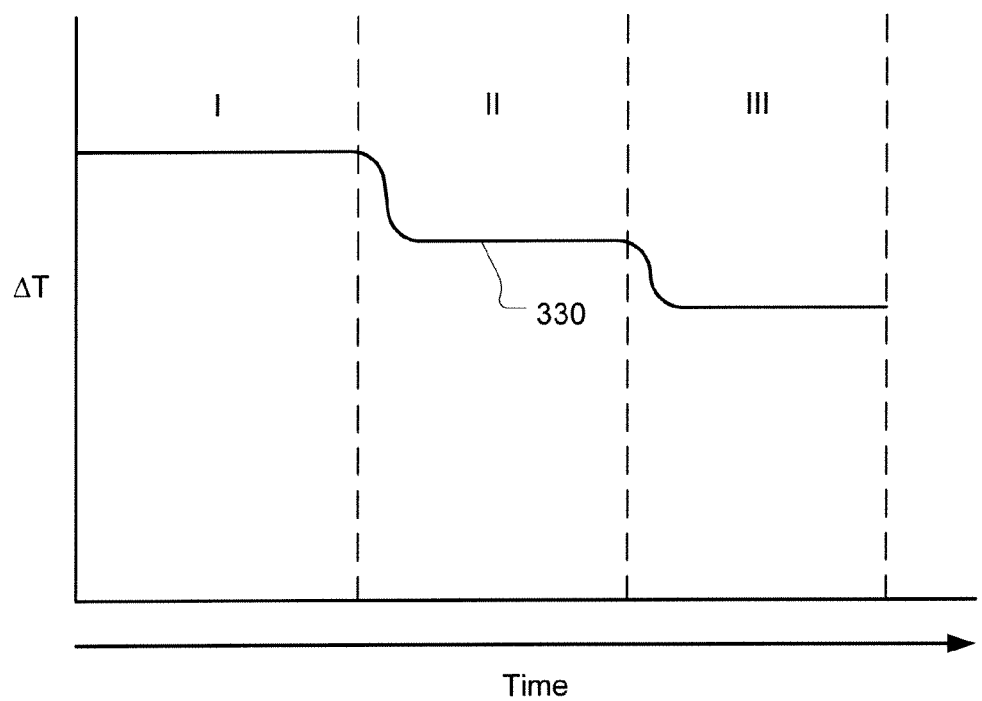
FIG. 3D shows an example of temperature differential ($\Delta T$) versus etching process time, in accordance with one embodiment of the present invention.

FIG. 3D shows an example of temperature differential ($\Delta T$) versus etching process time, in accordance with one embodiment of the present invention. The example of FIG. 3D shows three stages (I, II, and III) during the etching process. Stage I of the etching process involves initial etching of the opening. Stage II of the etching process involves etching deeper into the opening. Stage III of the etching process involves over-etching to ensure the opening in the target material reaches a desired depth and/or exposes a material layer underneath the target material being etched. For example, if the target material is a dielectric film and the opening is for a contact or a via, the stage III over-etching may serve to clear any remaining dielectric film in the opening to ensure that the opening reaches the metal layer underneath the dielectric layer.

In the example of FIG. 3D, the temperature differential ($\Delta T$) between the upper electrode and the substrate is the largest during stage I of the etching process. In stage I, deposition of larger mass polymer is desired in order to cover the photoresist mask material so as to reduce loss of photoresist mask material, and also to cover the sidewall of the opening to inhibit lateral etching. By maintaining a higher temperature differential ($\Delta T$) during stage I of the etching process, larger mass polymer particles are distributed near the substrate surface. During stage II of the example etching process of FIG. 3D, the etching constituents of the plasma need to reach deeper into the etched feature. Thus, during stage II of the etching process, it is necessary to avoid excessive polymer deposition within the etched feature in order to prevent the deposited polymer from restricting access of the etching constituents of the plasma to the etching front at the bottom of the opening 305. By lowering the temperature differential (ΔT) during stage II of the etching process, a more uniform mass distribution of polymer particles is achieved near the substrate surface. And, during stage III of the etching process, additional polymer deposition is not necessary. Therefore, an even lower temperature differential (ΔT) is applied during stage III to ensure that larger mass polymer does not interfere with the over-etching deep within the etched feature.

Etching resistant materials present within the plasma, such as polymer material, generally exists in the form of particles. These particles are characterized in part by a sticking coefficient ($S_c$), which is defined as the number of particles that stick to a surface divided by the number of particles that contact the surface. Therefore, a higher sticking coefficient ($S_c$) of polymer material refers to more sticking of the polymer material on a surface. For polymer material, the sticking coefficient ($S_c$) is a function of temperature and decreases with increased temperature. Therefore, an increase in substrate temperature corresponds to a decrease in polymer sticking coefficient ($S_c$), i.e., a less sticky polymer on the substrate.

During the etching process, the temperature of the substrate, e.g., wafer, is controlled to make sure that polymer material which flows into the etched region will stick to the sidewalls of the etched region enough to protect them from lateral etching, which could lead to undercutting. However, the temperature of the substrate is also controlled to avoid excessive build up of polymer material on the sidewalls of the etched region, which could lead to capping of the etched region by the polymer material. For example, during some phases of the etching process, it is desirable to reduce the amount of polymer that reaches the bottom of the etched region in order to keep the etching front clear. To accomplish this, the substrate temperature can be decreased to increase the sticking coefficient ($S_c$) of the polymer so that the polymer sticks to the top of the mask and sidewalls of the etched region before reaching the bottom of the etched region.

It should be understood that the temperature differential (ΔT) between the upper electrode and the substrate controls the amount of etching resistant material, e.g., polymer, directed toward the substrate, by controlling the spatial mass distribution of the etching resistant material within the plasma. Also, it should be understood that the temperature of the substrate controls the sticking coefficient ($S_c$) of the etching resistant material, e.g., polymer, which controls how much of the etching resistant material adheres to the substrate. Therefore, deposition of etching resistant material on the substrate during the plasma etching process can be controlled by controlling by the temperature of the substrate and the temperature differential between the substrate and other surfaces within the plasma chamber, such as the upper electrode.

Figure 3E:
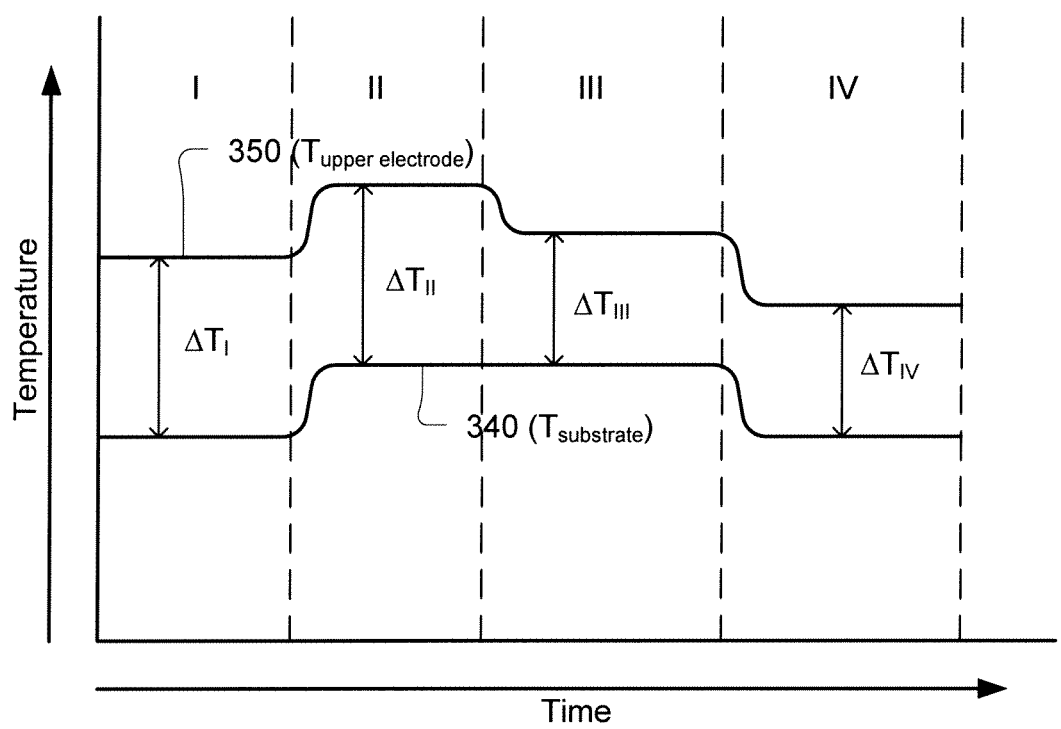
FIG. 3E shows example temperature profiles of the upper electrode $T_{upper\ electrode}$ and substrate $T_{substrate}$ during a plasma etching process, in accordance with one embodiment of the present invention.

FIG. 3E shows example temperature profiles of the upper electrode $T_{upper\ electrode}$ (350) and substrate $T_{substrate}$ (340) during a plasma etching process, in accordance with one embodiment of the present invention. The temperature differential (ΔT) between the upper electrode and the substrate at any point during the etching process is given by $T_{upper\ electrode} - T_{substrate}$. It should be understood that the temperature profiles of FIG. 3E are provided for discussion purposes and do not limit in any way the possible temperature profiles that can be applied during plasma processing of a substrate. In various embodiments, a plasma process can be represented by essentially any number of process steps, with each process step potentially including a change in substrate temperature and/or temperature differential between the substrate and upper electrode (or between the substrate and other temperature controlled surface within the plasma chamber).

The plasma etching process in the example of FIG. 3E includes four steps (or stages) (I, II, III, IV). The temperature of the substrate $T_{substrate}$ (340) increases from step I to step II, stays constant through step III, then decreases in step IV. The temperature differential (ΔT) between the substrate and the upper electrode stays the same from step I to step II, decreases from step II to step III, and stays the same from step III to step IV. Control of the temperature differential (ΔT) between the substrate and the upper electrode determines the magnitude of the polymer flux directed toward the substrate. Control of the substrate temperature determines how the polymer flux near the substrate is managed with regard to its adhesion to the substrate. The methods disclosed herein provide for controlling the substrate temperature and the temperature differential between the substrate and the upper electrode (or other chamber surface) in order to control polymer deposition on the substrate and within etched features during the plasma etching process.

Figure 4A:
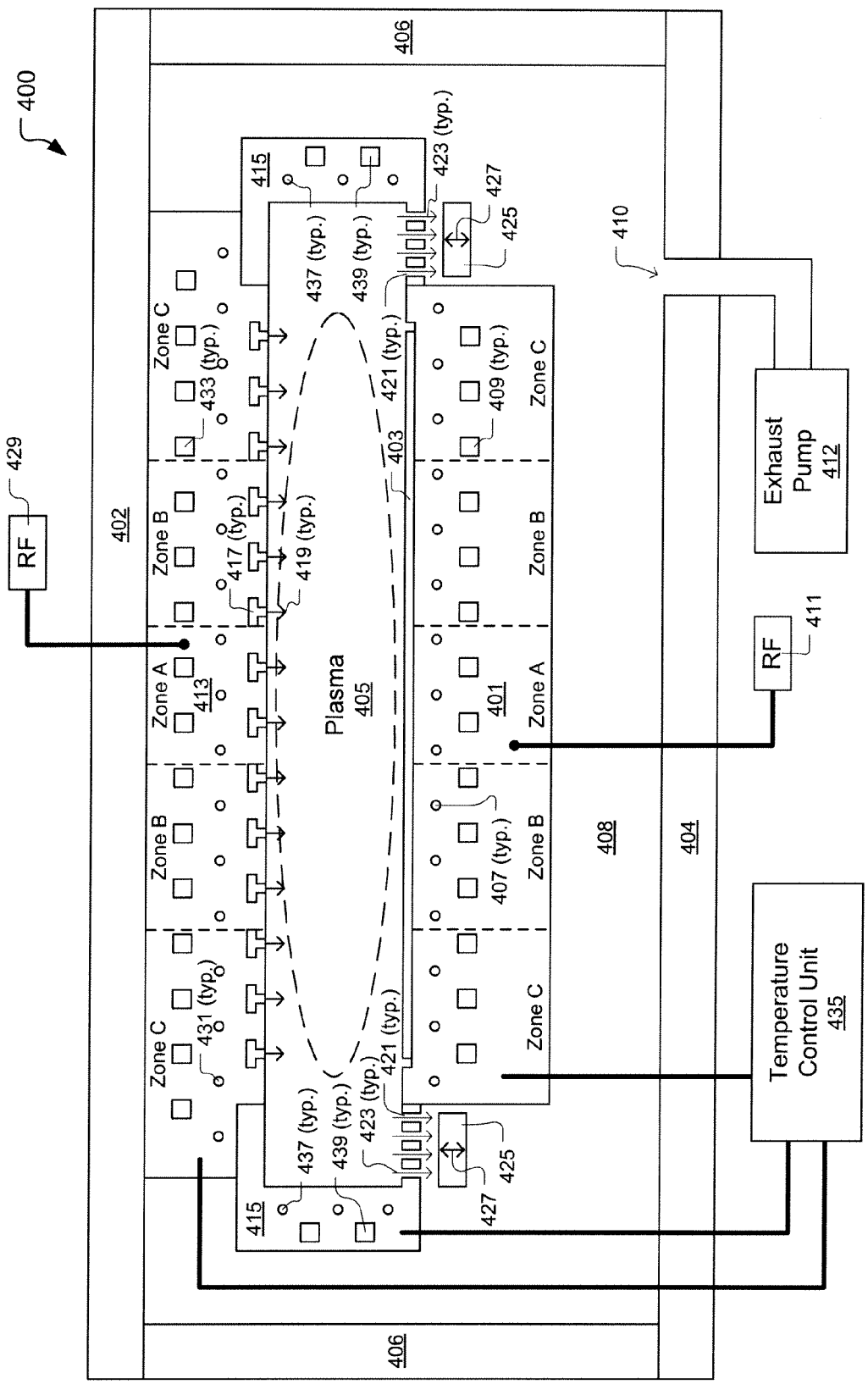
FIG. 4A shows an example plasma processing chamber, in accordance with one embodiment of the present invention.

FIG. 4A shows an example plasma processing chamber 400, in accordance with one embodiment of the present invention. The chamber 400 is defined by a top plate 402, a bottom plate 404, and enclosing walls 406. An interior cavity 408 of the chamber 400 is fluidly connected to an exhaust port 410, which is connected to an exhaust pump 412, for removal of gases from the interior cavity 408. Within the chamber 400, an upper electrode assembly 413 is disposed above and spaced apart from a substrate holder 401. A peripheral shroud assembly 415 is defined between the upper electrode assembly 413 and the substrate holder 401 to form a peripheral boundary of a plasma generation volume 405 between the upper electrode assembly 413 and the substrate holder 401.

In one embodiment, process gases are flowed into the plasma generation volume 405 through ports 417 in the upper electrode assembly 413, as indicated by arrows 419. Also, in one embodiment, process gases are flowed out of the plasma generation volume 405 through ports 421 in the peripheral shroud assembly 415, as indicated by arrows 423, into the interior cavity 408 of the chamber 400, from which they can be exhausted through the exhaust port 410. In one embodiment, a pressure control ring 425 is disposed proximate to the ports 421, and is movable in the direction 427 toward and away from the ports 421, to enable throttling of the fluid flow from the plasma generation volume 405 through the ports 421. Also, in some embodiments, the process gas supply ports 417 in the upper electrode assembly 413 are defined in multiple concentric zones (e.g., Zones A, B, C in FIG. 4A), with each zone having separate and independent capability with regard to process gas source and flow rate. It should be understood that the process gas supply and flow control configurations depicted in FIG. 4A are provided by way of example, and do not limit the principles of the invention disclosed herein.

The upper electrode assembly 413 is connected to a radiofrequency (RF) power source 429 and is defined to transmit RF power to the plasma generation volume 405. The RF power supplied to the upper electrode assembly 413 can be single frequency or multiple frequency. The upper electrode assembly 413 also includes a number of heating elements 431 and a number of cooling elements 433. In one embodiment, the heating elements 431 are defined as resistance heaters. Also, in one embodiment, the cooling elements 433 are defined as channels through which cooling fluid can be flowed. However, it should be understood, that in various embodiments the heating elements 431 and cooling elements 433 can be defined in different ways so long as they provide for controlled heating and cooling, respectively, of the upper electrode assembly 413.

Figure 4B:
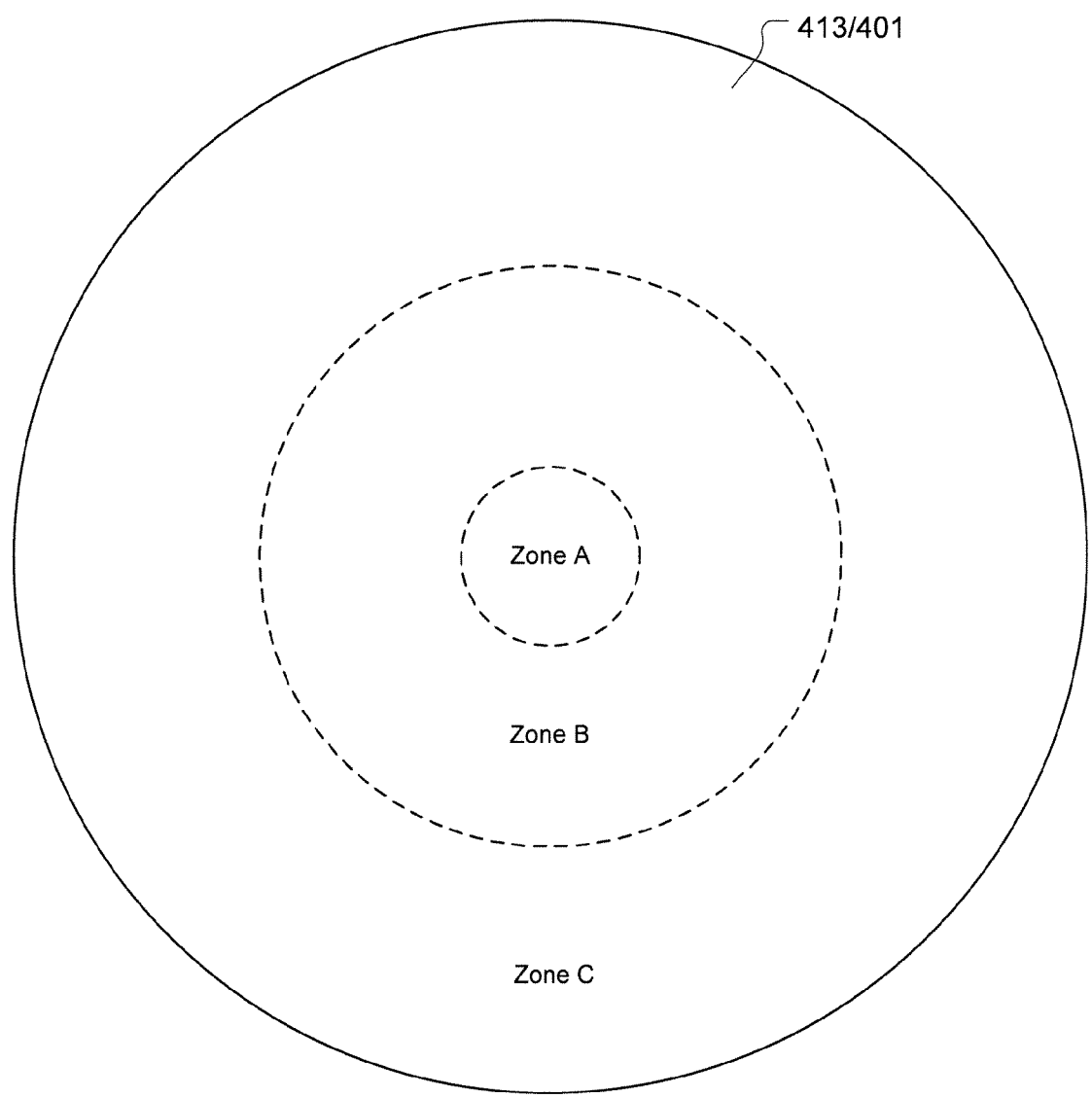
FIG. 4B shows a top view of the multiple concentric temperature control zones of the upper electrode assembly and substrate holder in the example of FIG. 4A, in accordance with one embodiment of the present invention.

Also, the heating elements 431 and/or cooling elements 433 of the upper electrode assembly 413 can be defined in multiple concentric zones, with each zone having separate and independent capability with regard to temperature control. For example, FIG. 4A shows three temperature control zones (Zones A, B, C) in the upper electrode assembly 413. FIG. 4B shows a top view of the concentrically-defined temperature control zones of the upper electrode assembly 413, in accordance with one embodiment of the present invention. The upper electrode assembly 413 includes a number of temperature measurement devices, such as thermocouples, that provide temperature measurements to a temperature control module 435. In the case of multiple zoned heating and/or cooling elements, each zone may include one or more temperature measurement devices connected to the temperature control module 435. The point to be understood is that the upper electrode assembly 413 includes effective, rapid, and precise temperature control capability, and accurate temperature measurement/monitoring capability.

The substrate holder 401 is defined to hold a substrate 403, such as a semiconductor wafer, in exposure to the plasma generation volume 405. In one embodiment, the substrate holder 401 is connected to a radiofrequency (RF) power supply 411, so as to transmit RF power to the plasma generation volume 405. The RF power supply 411 can be either single frequency or multiple frequency. Also, in another embodiment, the substrate holder 401 can be connected to a reference ground potential. In one embodiment, the substrate holder 401 is defined as an electrostatic chuck (ESC).

The substrate holder 401 includes a number of heating elements 407 and a number of cooling elements 409. In one embodiment, the heating elements 407 are defined as resistance heaters. Also, in one embodiment, the cooling elements 409 are defined as channels through which cooling fluid is flowed. However, it should be understood, that in various embodiments the heating elements 407 and cooling elements 409 of the substrate holder 401 can be defined in different ways so long as they provide a controlled heating and cooling capability, respectively, of the substrate holder 401.

Also, the heating elements 407 and/or cooling elements 409 of the substrate holder 401 can be defined in multiple concentric zones, with each zone having separate and independent capability with regard to temperature control. For example, the substrate holder 401 includes three temperature control zones (Zones A, B, C) that substantially match the temperature control zone configuration of the upper electrode assembly 413. The substrate holder 401 includes a number of temperature measurement devices, such as thermocouples, that provide temperature measurements to the temperature control module 435. In the case of multiple zoned heating and/or cooling elements, each zone may include one or more temperature measurement devices connected to the temperature control module 435. The point to be understood is that the substrate holder 401 includes effective, rapid, and precise temperature control capability, and accurate temperature measurement/monitoring capability.

Additionally, in one embodiment, the peripheral shroud assembly 415 can include a number of heating elements 437 and a number of cooling elements 439. In one embodiment, the heating elements 437 are defined as resistance heaters. Also, in one embodiment, the cooling elements 439 are defined as channels through which cooling fluid can be flowed. However, it should be understood, that in various embodiments the heating elements 437 and cooling elements 439 can be defined in different ways so long as they provide a controlled heating and cooling, respectively, of the peripheral shroud assembly 415. Also, the peripheral shroud assembly 415 includes a number of temperature measurement devices, such as thermocouples, that provide temperature measurements to the temperature control module 435. Again, the point to be understood is that the peripheral shroud assembly 415 includes effective, rapid, and precise temperature control capability, and accurate temperature measurement/monitoring capability.

Figure 5:
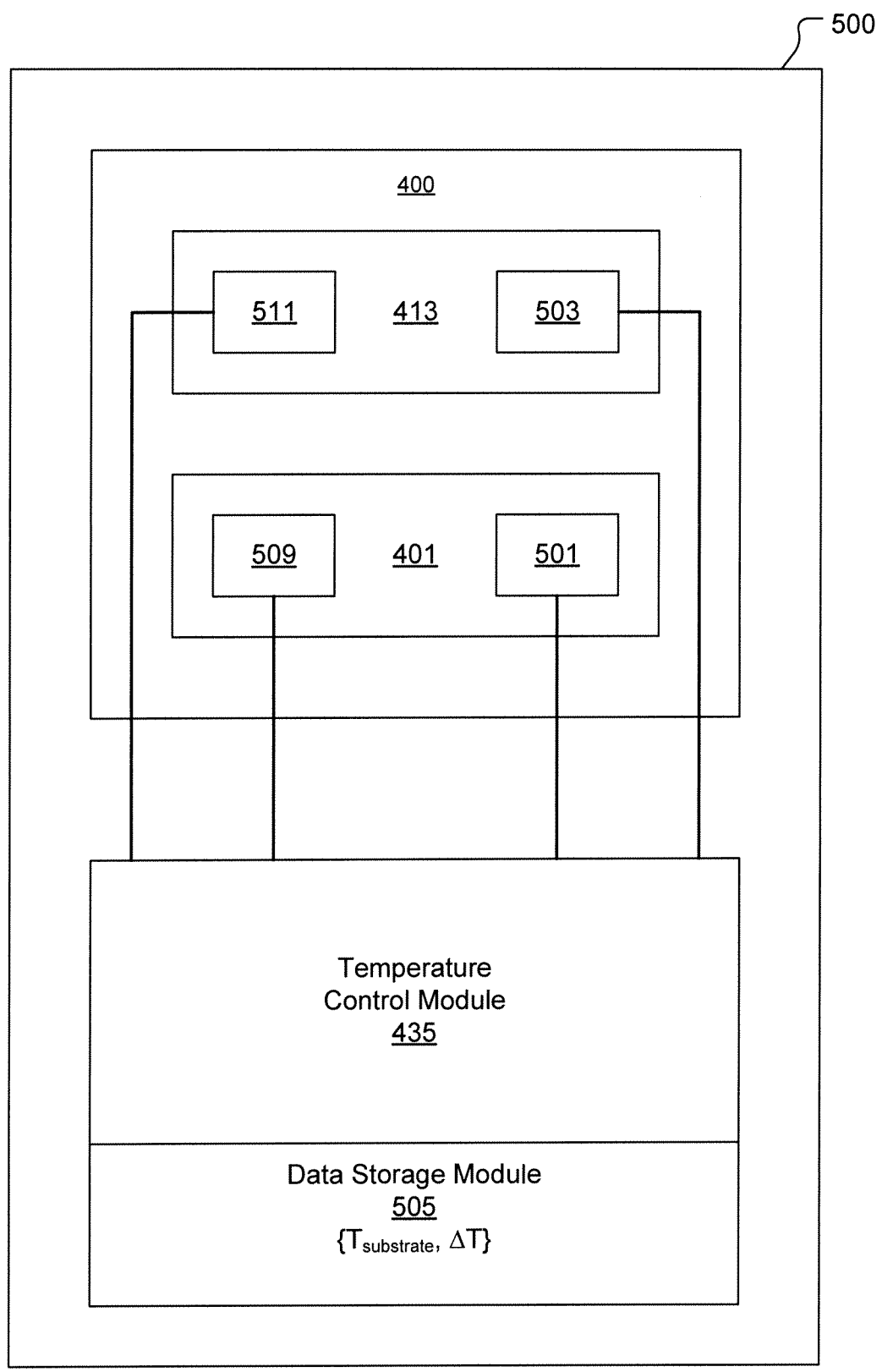
FIG. 5 shows a system for plasma processing of a substrate, based on the example plasma processing chamber of FIG. 4A, in accordance with one embodiment of the present invention.

FIG. 5 shows a system 500 for plasma processing of a substrate, based on the example plasma processing chamber 400 of FIG. 4A, in accordance with one embodiment of the present invention. The system 500 includes the plasma processing chamber 400, the substrate holder 401 disposed within the chamber 400, and the upper electrode assembly 413 disposed within the chamber 400 above and spaced apart from the substrate holder 401. The substrate holder 401 includes one or more temperature control devices 509, such as the heating elements 407 and cooling elements 409, discussed with regard to FIG. 4A. The temperature control devices 509 are connected to be controlled by the temperature control module 435. The upper electrode assembly 413 includes one or more temperature control devices 511, such as the heating elements 431 and cooling elements 433, discussed with regard to FIG. 4A. The temperature control devices 511 are connected to be controlled by the temperature control module 435.

A first temperature measurement device 501 is disposed to measure a temperature of the substrate holder 401. It should be understood that the first temperature measurement device 501 can represent one or more temperature measurement devices. And, in the case of multiple temperature control zones within the substrate holder 401, the first temperature measurement device 501 can represent multiple temperature measurement devices respectively corresponding to the multiple temperature control zones. The first temperature measurement device 501 is connected to the temperature control module 435.

A second temperature measurement device 503 is disposed to measure a temperature of the upper electrode assembly 413. It should be understood that the second temperature measurement device 503 can represent one or more temperature measurement devices. And, in the case of multiple temperature control zones within the upper electrode assembly 413, the second temperature measurement device 503 can represent multiple temperature measurement devices respectively corresponding to the multiple temperature control zones. The second temperature measurement device 503 is connected to the temperature control module 435.

The system 500 also includes a data storage module 505 defined to store temperature data that can be retrieved and utilized by the temperature control module 435. In one embodiment, the data storage module 505 is a computer memory. However, it should be understood that in other embodiments, the data storage module 505 can be defined in essentially any manner so long as the data storage module 505 is capable of storing temperature data that can be retrieved and utilized by the temperature control module 435. In one embodiment, the data storage module 505 is defined within the system 500. In other embodiments, the data storage module 505 is defined separate form the system 500, but in data communication with the system 505. For example, the temperature control module 435 may be defined to communicate through either a wired connection or a wireless connection to a computing device defined outside of the system 505, with the computing device defined to maintain the data storage module 505.

The data storage module 505 includes data that defines a time-dependent substrate temperature to be applied during a plasma process. The time-dependent substrate temperature data is provided as an input from the data storage module 505 to the temperature control module 435. The time-dependent substrate temperature data at any given time is correlated to control of a sticking coefficient ($S_c$) of a plasma constituent at the given time. And, the temperature of the substrate is correlated to the temperature of the substrate holder 401 measured by the first temperature measurement device 501.

The data storage module 505 also includes data that defines a time-dependent temperature differential between the upper electrode assembly and the substrate to be applied during the plasma process. The time-dependent substrate temperature differential data is provided as an input from the data storage module 505 to the temperature control module 435. The time-dependent temperature differential data at any given time is correlated to control of a flux of the plasma constituent toward the substrate at the given time.

The temperature control module 435 is defined to control the one or more temperature control devices 509 of the substrate holder 401 to maintain a target substrate 403 temperature. In one embodiment, the target substrate 403 temperature is a time-dependent substrate temperature to be applied during a plasma process. The time-dependent substrate 403 temperature at any given time is correlated to control of a sticking coefficient of a plasma constituent at the given time.

The temperature control module 435 is further defined to control the one or more temperature control devices 511 of the upper electrode assembly 413 to maintain a target temperature differential between the substrate 403 and the upper electrode assembly 413. In one embodiment, the target temperature differential between the substrate 403 and the upper electrode assembly 413 is a time-dependent temperature differential between the substrate 403 and the upper electrode assembly 413 to be applied during a plasma process. The time-dependent temperature differential at any given time is correlated to control of a flux of a plasma constituent toward the substrate 403 at the given time.

In one embodiment, each of the substrate holder 401 and the upper electrode assembly 413 is defined to include multiple radially concentric temperature control zones with respective temperature control devices therein. In this embodiment, the time-dependent substrate temperature data is provided from the data storage module 505 for each of the multiple radially concentric temperature control zones of the substrate holder 401. Also in this embodiment, the time-dependent temperature differential data between the upper electrode assembly 413 and the substrate 401 is provided from the data storage module 505 for each of the multiple radially concentric temperature control zones of the upper electrode assembly 413.

Figure 6:
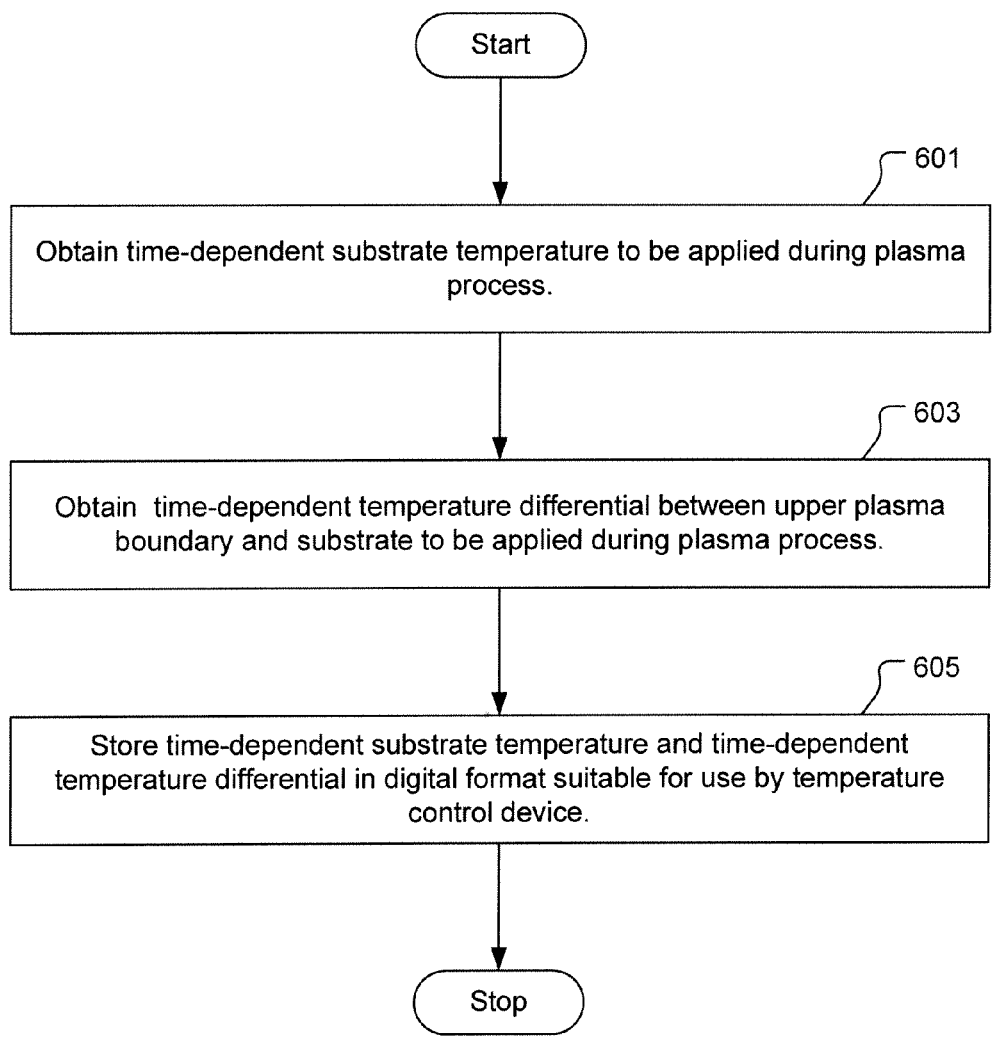
FIG. 6 shows a flowchart of a method for defining a plasma process to be performed on a substrate, in accordance with one embodiment of the present invention.

FIG. 6 shows a flowchart of a method for defining a plasma process to be performed on a substrate, in accordance with one embodiment of the present invention. The method includes an operation 601 for determining a time-dependent substrate temperature to be applied during the plasma process. The time-dependent substrate temperature at any given time is determined based on control of a sticking coefficient ($S_c$) of a plasma constituent at the given time. The sticking coefficient ($S_c$) is a temperature dependent parameter that represents an affinity of the plasma constituent to adhere to the substrate. An increase in substrate temperature corresponds to a reduced sticking coefficient ($S_c$) representing a lower affinity of the plasma constituent to adhere to the substrate. A decrease in substrate temperature corresponds to an increased sticking coefficient ($S_c$) representing a higher affinity of the plasma constituent to adhere to the substrate. In one embodiment, the plasma constituent is a polymer that is resistant to etching capabilities of the plasma process.

The method also includes an operation 603 for determining a time-dependent temperature differential between an upper plasma boundary and a substrate to be applied during the plasma process. In one embodiment, the upper plasma boundary is defined by a surface of an upper electrode assembly that is exposed to the plasma. The substrate serves as a lower plasma boundary. The time-dependent temperature differential at any given time is determined based on control of a flux of the plasma constituent directed toward the substrate at the given time. The time-dependent temperature differential is defined based on a thermophoresis effect on the plasma constituent, whereby higher mass portions of the plasma constituent move toward lower temperature regions, and whereby lower mass portions of the plasma constituent move toward higher temperature regions. The movement of the plasma constituent based on its mass and regional temperatures to which it is exposed controls the flux of the plasma constituent directed toward the substrate.

The method further includes an operation 605 for storing the determined time-dependent substrate temperature and time-dependent temperature differential in a digital format suitable for use by a temperature control device. The temperature control device is defined and connected to direct temperature control of the upper plasma boundary and the substrate during the plasma process. Also, in one embodiment, each of the time-dependent substrate temperature and the time-dependent temperature differential between the upper plasma boundary and the substrate is defined as a function of radial position extending from a center of the substrate to a periphery of the substrate.

In one embodiment, the method includes an operation for determining a time-dependent substrate support temperature necessary to achieve the time-dependent substrate temperature determined in operation 601, by way of the substrate being held in thermal contact with the substrate support during the plasma process. This embodiment also includes an operation for storing the determined time-dependent substrate support temperature in a digital format suitable for use by a temperature control device defined and connected to direct temperature control of the substrate support during the plasma process.

In one embodiment, the plasma process includes a high aspect ratio feature etching process in which a number of high aspect ratio features are etched into one or more materials present on the substrate. In this embodiment, the time-dependent temperature differential between the upper plasma boundary and the substrate is set during the high aspect ratio feature etching process to ensure that the flux of the plasma constituent toward the substrate provides sufficient amounts of appropriate masses of the plasma constituent near the substrate and within the number of high aspect ratio features. Also, in this embodiment, the time-dependent substrate temperature is set during the high aspect ratio feature etching process to ensure that a sufficient amount of the plasma constituent adheres to the substrate so as to: 1) preserve the mask through completion of the plasma process, 2) ensure that a sufficient amount of the plasma constituent adheres to sidewalls of the number of high aspect ratio features to protect the sidewalls from being adversely undercut, and 3) ensure that the number of high aspect ratio features remain open through completion of the plasma process.

Figure 7:
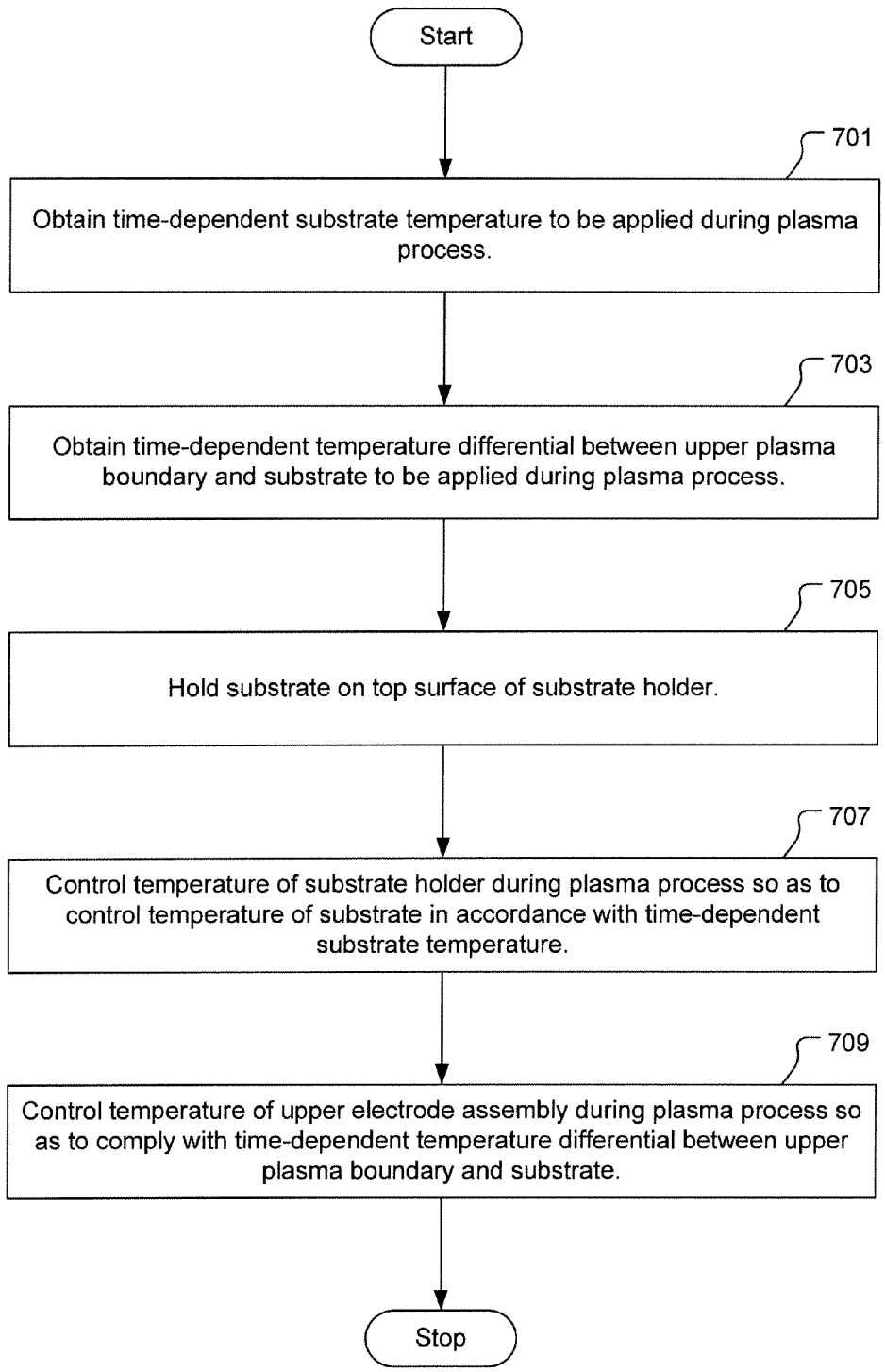
FIG. 7 shows a flowchart of a method for operating a plasma processing chamber, in accordance with one embodiment of the present invention.

FIG. 7 shows a flowchart of a method for operating a plasma processing chamber, in accordance with one embodiment of the present invention. The method includes an operation 701 for obtaining a time-dependent substrate temperature to be applied during a plasma process. The time-dependent substrate temperature at any given time is correlated to control of a sticking coefficient ($S_c$) of a plasma constituent at the given time. In one embodiment, the plasma constituent is a polymer that is resistant to etching capabilities of the plasma process.

The method also includes an operation 703 for obtaining a time-dependent temperature differential between an upper plasma boundary and a substrate to be applied during the plasma process. In one embodiment, the upper plasma boundary is defined by a surface of an upper electrode assembly that is exposed to the plasma. The substrate serves as a lower plasma boundary. The time-dependent temperature differential at any given time is correlated to control of a flux of the plasma constituent toward the substrate at the given time.

The method also includes an operation 705 for holding the substrate on a top surface of a substrate holder. The substrate holder is disposed at a location below and spaced apart from the upper electrode assembly which defines the upper plasma boundary. The method also includes an operation 707 for controlling a temperature of the substrate holder during the plasma process so as to control a temperature of the substrate in accordance with the time-dependent substrate temperature. Controlling the temperature of the substrate holder includes operating a heater within the substrate holder, a chiller within the substrate holder, or a combination thereof.

The method also includes an operation 709 for controlling a temperature of the upper electrode assembly during the plasma process so as to comply with the time-dependent temperature differential between the upper plasma boundary and the substrate. Controlling the temperature of the upper electrode assembly includes operating a heater within the upper electrode assembly, a chiller within the upper electrode assembly, or a combination thereof.

In one embodiment, each of the substrate holder and the upper electrode assembly is defined to include multiple radially concentric temperature control zones. In this embodiment, the time-dependent substrate temperature is obtained for each of the multiple radially concentric temperature control zones of the substrate holder. Also in this embodiment, the time-dependent temperature differential between the upper plasma boundary and the substrate is obtained for each of the multiple radially concentric temperature control zones of the upper electrode assembly.

In one embodiment, the method includes an operation for measuring a temperature of the substrate holder during the plasma process. A substrate holder temperature control feedback signal is generated based on the measured temperature of the substrate holder. And, the temperature of the substrate holder is controlled based on the substrate holder temperature control feedback signal to maintain the temperature of the substrate in accordance with the time-dependent substrate temperature.

The method can also include an operation for measuring a temperature of the upper electrode assembly during the plasma process. An upper electrode assembly temperature control feedback signal is generated based on the measured temperature of the upper electrode assembly. And, the temperature of the upper electrode assembly is controlled based on the upper electrode assembly temperature control feedback signal and the substrate holder temperature control feedback signal, so as to maintain a temperature difference between the upper electrode assembly and the substrate holder in accordance with the time-dependent temperature differential between the upper plasma boundary and the substrate.

Additionally, in one embodiment, the method includes an operation for measuring a temperature of peripheral components during the plasma process. The peripheral components are located within the plasma processing chamber around a plasma generation volume. A peripheral component temperature control feedback signal is generated based on the measured temperature of the peripheral components. The temperature of the peripheral components is controlled based on the peripheral component temperature control feedback signal to maintain a target temperature of the peripheral components during the plasma process. Controlling the temperature of the peripheral components includes operating a heater within the peripheral components, a chiller within the peripheral components, or a combination thereof. In various embodiments, the peripheral components include confinement rings, a peripheral shroud, or a combination thereof. Also, the target temperature of the peripheral components can be specified as a function of time during the plasma process.

Example embodiments discussed herein identify a polymer specie within the plasma as an etching resistant material whose deposition on the substrate is controllable through substrate temperature control and through control of differential temperature across the plasma generation volume. However, it should be understood that the methods disclosed herein can be applied to control deposition of essentially any plasma specie that has a differential mass distribution subject to thermophoresis effects, and that is capable of depositing as a protective layer on the substrate. Also, it should be understood that the plasma referenced herein can be generated through either inductive means, capacitive means, or a combination thereof. Additionally, the methods disclosed herein can be applied to plasma processing of essentially any type of substrate, including but not limited to semiconductor substrates, flat panel displays, solar panels, and the like.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for plasma processing of a substrate, comprising:
   a plasma processing chamber;
   a substrate holder disposed within the plasma processing chamber and defined to hold a substrate, wherein the substrate holder includes one or more temperature control devices;
   an upper electrode assembly disposed within the plasma processing chamber above and spaced apart from the substrate holder, wherein the upper electrode assembly includes one or more temperature control devices;
   a first temperature measurement device disposed to measure a temperature of the substrate holder, wherein the temperature of the substrate holder is correlated to the temperature of the substrate held thereon;
   a second temperature measurement device disposed to measure a temperature of the upper electrode assembly;
   a data storage module having data stored therein that defines a time-dependent substrate temperature to be applied during a plasma process, the data storage module having data stored therein that defines a time-dependent temperature differential between the upper electrode assembly and the substrate to be applied during the plasma process; and a temperature control module connected to receive substrate holder temperature measurements from the first temperature measurement device, the temperature control module connected to receive upper electrode assembly temperature measurements from the second temperature measurement device, the temperature control module connected to receive data from the data storage module that defines the time-dependent substrate temperature, the temperature control module connected to receive data from the data storage module that defines the time-dependent temperature differential between the upper electrode assembly and the substrate, the temperature control module connected to transmit control signals to the one or more temperature control devices of the substrate holder, the temperature control module connected to transmit control signals to the one or more temperature control devices of the upper electrode assembly, the temperature control module configured to correlate the received substrate holder temperature measurements to corresponding substrate temperature measurements, the temperature control module configured to compare the substrate temperature measurements at a given time to the received data that defines the time-dependent substrate temperature at the given time to determine a substrate holder temperature adjustment required at the given time, the temperature control module configured to transmit control signals to the one or more temperature control devices of the substrate holder to affect the substrate holder temperature adjustment required at the given time, the temperature control module configured to determine a temperature differential at the given time between the received upper electrode assembly temperature measurements at the given time and the substrate temperature measurements at the given time, the temperature control module configured to compare the determined temperature differential at the given time to the received data that defines the time-dependent temperature differential between the upper electrode assembly and the substrate at the given time to determine an upper electrode assembly temperature adjustment required at the given time, the temperature control module configured to transmit control signals to the one or more temperature control devices of the upper electrode assembly to affect the upper electrode assembly temperature adjustment required at the given time, wherein the time-dependent temperature differential between the upper electrode assembly and the substrate at the given time is correlated to control of a flux of a plasma constituent toward the substrate at the given time.

2. The system as recited in claim 1, wherein the time-dependent substrate temperature at the given time is correlated to control of a sticking coefficient of a plasma constituent at the given time.

3. The system as recited in claim 1, wherein the one or more temperature control devices of the substrate holder includes a chiller and a heater embedded within the substrate holder.

4. The system as recited in claim 1, wherein the one or more temperature control devices of the upper electrode assembly includes a chiller and a heater embedded within the upper electrode assembly.

5. The system as recited in claim 1, wherein each of the substrate holder and the upper electrode assembly is defined to include multiple radially concentric temperature control zones with respective temperature control devices therein.

6. The system as recited in claim 2, wherein the sticking coefficient is a temperature dependent parameter that represents an affinity of the plasma constituent to adhere to the substrate, wherein an increase in substrate temperature corresponds to a reduced sticking coefficient representing a lower affinity of the plasma constituent to adhere to the substrate, and wherein a decrease in substrate temperature corresponds to an increased sticking coefficient representing a higher affinity of the plasma constituent to adhere to the substrate.

7. The system as recited in claim 1, wherein the time-dependent temperature differential is defined based on a thermophoresis effect on the plasma constituent in which higher mass portions of the plasma constituent move toward lower temperature regions and lower mass portions of the plasma constituent move toward higher temperature regions.

8. The system as recited in claim 7, wherein movement of the plasma constituent based on its mass and regional temperatures to which it is exposed controls the flux of the plasma constituent directed toward the substrate at the given time.

9. The system as recited in claim 1, wherein the time-dependent substrate temperature to be applied during the plasma process is defined as a function of radial position extending from a center of the substrate to a periphery of the substrate, and wherein the time-dependent temperature differential between the upper electrode assembly and the substrate to be applied during the plasma process is defined as a function of radial position extending from the center of the substrate to the periphery of the substrate.

10. The system as recited in claim 1, further comprising:

a peripheral shroud assembly disposed within the plasma processing chamber between the upper electrode assembly and the substrate holder, the peripheral shroud assembly forming a peripheral boundary of a plasma generation volume between the upper electrode assembly and the substrate holder, wherein the peripheral shroud assembly includes one or more temperature control devices; and a third temperature measurement device disposed to measure a temperature of the peripheral shroud assembly.

11. The system as recited in claim 10, wherein the data storage module includes data stored therein that defines a time-dependent peripheral shroud assembly temperature to be applied during the plasma process, the temperature control module connected to receive data from the data storage module that defines the time-dependent peripheral shroud assembly temperature.

12. The system as recited in claim 11, wherein the temperature control module is connected to receive peripheral shroud assembly temperature measurements from the third temperature measurement device, and wherein the temperature control module is connected to transmit control signals to the one or more temperature control devices of the peripheral shroud assembly.

13. The system as recited in claim 12, wherein the temperature control module is configured to generate a peripheral shroud assembly temperature control feedback signal based on the peripheral shroud assembly temperature measurements, wherein the peripheral shroud assembly temperature is controlled based on the peripheral shroud assembly temperature control feedback signal to maintain a target temperature of the peripheral shroud assembly.

14. A method for manufacturing a system for plasma processing of a substrate, comprising:
forming a plasma processing chamber;
disposing a substrate holder within the plasma processing chamber, the substrate holder configured to hold a substrate, the substrate holder including one or more temperature control devices;
disposing an upper electrode assembly within the plasma processing chamber above and spaced apart from the substrate holder, the upper electrode assembly including one or more temperature control devices;
disposing a first temperature measurement device for measurement of a temperature of the substrate holder, wherein the temperature of the substrate holder is correlated to the temperature of the substrate held thereon;
disposing a second temperature measurement device for measurement of a temperature of the upper electrode assembly;
providing a data storage module having data stored therein that defines a time-dependent substrate temperature to be applied during a plasma process, the data storage module having data stored therein that defines a time-dependent temperature differential between the upper electrode assembly and the substrate to be applied during the plasma process; and
connecting a temperature control module to receive substrate holder temperature measurements from the first temperature measurement device;
connecting the temperature control module to receive upper electrode assembly temperature measurements from the second temperature measurement device;
connecting the temperature control module to receive data from the data storage module that defines the time-dependent substrate temperature, and to receive data from the data storage module that defines the time-dependent temperature differential between the upper electrode assembly and the substrate;
connecting the temperature control module to transmit control signals to the one or more temperature control devices of the substrate holder;
connecting the temperature control module to transmit control signals to the one or more temperature control devices of the upper electrode assembly,
wherein the temperature control module is configured to correlate the received substrate holder temperature measurements to corresponding substrate temperature measurements, and wherein the temperature control module is configured to compare the substrate temperature measurements at a given time to the received data that defines the time-dependent substrate temperature at the given time to determine a substrate holder temperature adjustment required at the given time, and wherein the temperature control module is configured to transmit control signals to the one or more temperature control devices of the substrate holder to affect the substrate holder temperature adjustment required at the given time, and wherein the temperature control module is configured to determine a temperature differential at the given time between the received upper electrode assembly temperature measurements at the given time and the substrate temperature measurements at the given time, and wherein the temperature control module is configured to compare the determined temperature differential at the given time to the received data that defines the time-dependent temperature differential between the upper electrode assembly and the substrate at the given time to determine an upper electrode assembly temperature adjustment required at the given time, and wherein the temperature control module is configured to transmit control signals to the one or more temperature control devices of the upper electrode assembly to affect the upper electrode assembly temperature adjustment required at the given time, wherein the time-dependent temperature differential between the upper electrode assembly and the substrate at the given time is correlated to control of a flux of a plasma constituent toward the substrate at the given time.

15. The method as recited in claim 14, wherein the time-dependent substrate temperature at the given time is correlated to control of a sticking coefficient of a plasma constituent at the given time.

16. The method as recited in claim 14, wherein each of the substrate holder and the upper electrode assembly is defined to include multiple radially concentric temperature control zones with respective temperature control devices therein.

17. The method as recited in claim 14, wherein the time-dependent substrate temperature to be applied during the plasma process is defined as a function of radial position extending from a center of the substrate to a periphery of the substrate, and wherein the time-dependent temperature differential between the upper electrode assembly and the substrate to be applied during the plasma process is defined as a function of radial position extending from the center of the substrate to the periphery of the substrate.

18. The method as recited in claim 14, further comprising:
disposing a peripheral shroud assembly within the plasma processing chamber between the upper electrode assembly and the substrate holder, the peripheral shroud assembly forming a peripheral boundary of a plasma generation volume between the upper electrode assembly and the substrate holder, wherein the peripheral shroud assembly includes one or more temperature control devices; and
disposing a third temperature measurement device for measurement of a temperature of the peripheral shroud assembly.

19. The method as recited in claim 18, wherein the data storage module includes data stored therein that defines a time-dependent peripheral shroud assembly temperature to be applied during the plasma process, the temperature control module connected to receive data from the data storage module that defines the time-dependent peripheral shroud assembly temperature.

20. The method as recited in claim 19, further comprising:
connecting the temperature control module to receive peripheral shroud assembly temperature measurements from the third temperature measurement device; and
connecting the temperature control module to transmit control signals to the one or more temperature control devices of the peripheral shroud assembly.

\* \* \* \* \*